(12) United States Patent
Tatsumi

(10) Patent No.: US 8,227,347 B2
(45) Date of Patent: Jul. 24, 2012

(54) INTERCONNECTING STRUCTURE PRODUCTION METHOD, AND INTERCONNECTING STRUCTURE

(75) Inventor: Noriyuki Tatsumi, Kasumigaura (JP)

(73) Assignee: Hitachi Cable, Ltd., Tokyo (JP)

( * ) Notice: Subject to any disclaimer, the term of this patent is extended or adjusted under 35 U.S.C. 154(b) by 154 days.

(21) Appl. No.: 12/761,742

(22) Filed: Apr. 16, 2010

(65) Prior Publication Data

US 2010/0264415 A1 Oct. 21, 2010

(30) Foreign Application Priority Data

Apr. 17, 2009 (JP) .................................. 2009-100703

(51) Int. Cl.
*H01L 21/44* (2006.01)
(52) U.S. Cl. ................................ 438/687; 257/E23.161
(58) Field of Classification Search .................. 438/482, 438/652, 687; 257/508, 636, 758, 771, 762, 257/751, 763, 522, E21.09
See application file for complete search history.

(56) References Cited

U.S. PATENT DOCUMENTS

| | | | |
|---|---|---|---|
| 6,531,750 B2 * | 3/2003 | Chan et al. ...................... | 257/394 |
| 2002/0132455 A1 * | 9/2002 | Muramatsu et al. ........... | 438/486 |
| 2006/0240677 A1 * | 10/2006 | Horii et al. ..................... | 438/770 |
| 2007/0145488 A1 * | 6/2007 | Koyama et al. ................ | 257/369 |
| 2008/0315203 A1 | 12/2008 | Hino et al. | |

FOREIGN PATENT DOCUMENTS

JP 2009-4518 1/2009

* cited by examiner

*Primary Examiner* — Victor A Mandala
*Assistant Examiner* — Selim Ahmed
(74) *Attorney, Agent, or Firm* — Scully, Scott, Murphy & Presser, P.C.

(57) ABSTRACT

An interconnecting structure production method includes providing a substrate, forming a semiconductor layer on the substrate, forming a doped semiconductor layer on the semiconductor layer, the doped semiconductor layer containing a dopant, forming an oxide layer in a surface of the doped semiconductor layer by heating the surface of the doped semiconductor layer in atmosphere of an oxidizing gas with a water molecule contained therein, forming an alloy layer on the oxide layer, and forming an interconnecting layer on the alloy layer.

8 Claims, 13 Drawing Sheets

INTERCONNECTING STRUCTURE PRODUCTION METHOD, AND INTERCONNECTING STRUCTURE

The present application is based on Japanese patent application No. 2009-100703 filed on Apr. 17, 2009, the entire contents of which are incorporated herein by reference.

BACKGROUND OF THE INVENTION

1. Field of the Invention

The present invention relates to an interconnecting structure (or wiring structure) production method and an interconnecting structure. In particular, it relates to an interconnecting structure (or wiring structure) production method and an interconnecting structure, for use in electronic device interconnections (or wirings).

2. Description of the Related Art

A conventional thin film transistor substrate with a semiconductor layer, source and drain electrodes for a thin film transistor is known, in which the source and drain electrodes each consist of an oxygen containing layer, and a thin pure copper or copper alloy film. Part or all of oxygen constituting the oxygen containing layers is bonded to silicon of the semiconductor layer of the thin film transistor. The thin pure copper or copper alloy films are connected to the semiconductor layer of the thin film transistor via the oxygen containing layers, respectively. The oxygen containing layers in this thin film transistor substrate are formed by plasma oxidation or thermal oxidation.

This thin film transistor substrate thus constructed can exhibit excellent TFT (thin film transistor) characteristics, even if no barrier metal layer is formed between the source and drain electrodes, and the semiconductor layer of the thin film transistor.

Refer to JP-A-2009-4518, for example.

However, the thin film transistor substrate disclosed by JP-A-2009-4518 may cause residual damage in the oxygen containing layers, when the oxygen containing layers are formed by plasma oxidation. Also, when the oxygen containing layers are formed by thermal oxidation, the thin film transistor substrate disclosed by JP-A-2009-4518 may be not practical in that the rate at which the oxygen containing layers form is as slow as on the order of a few nm/hour.

SUMMARY OF THE INVENTION

Accordingly, it is an object of the present invention to provide an interconnecting structure production method and an interconnecting structure, which is low in production cost.

(1) According to one embodiment of the invention, an interconnecting structure production method comprises:

providing a substrate;

forming a semiconductor layer on the substrate;

forming a doped semiconductor layer on the semiconductor layer, the doped semiconductor layer containing a dopant;

forming an oxide layer in a surface of the doped semiconductor layer by heating the surface of the doped semiconductor layer in atmosphere of an oxidizing gas with a water molecule contained therein;

forming an alloy layer on the oxide layer; and forming an interconnecting layer on the alloy layer.

In the above embodiment (1), the following modifications and changes can be made.

(i) The forming of the oxide layer includes bubbling the oxidizing gas through water to allow the oxidizing gas to contain water molecules.

(ii) The semiconductor layer includes an amorphous silicon layer, the doped semiconductor layer includes a silicon layer containing the dopant, and the forming of the oxide layer includes using an ozone gas as the oxidizing gas, heating the doped silicon layer in the ozone gas at a temperature of not less than 200° C. and not more than 300° C. to form a silicon oxide layer in the surface of the doped silicon layer.

(iii) The alloy layer includes a Cu alloy layer comprising Cu and an additive element, and the interconnecting layer includes a Cu layer.

(iv) The method further comprises:

forming a diffusion barrier layer by heating the Cu alloy layer at a temperature of not less than 200° C. and not more than 300° C. to allow the additive element contained in the Cu alloy layer to be condensed.

(v) The additive element comprises at least one metal element selected from the group consisting of Ni, Co, Mn, Zn, Mg, Al, Zr, Ti, Fe, and Ag.

(vi) The Cu alloy layer comprises Cu, and Ni or Mn with a concentration of not less than 1 at % and not more than 5 at % relative to the Cu.

(vii) The interconnecting layer includes the Cu layer comprising oxygen free copper with a purity of not less than 3 Nines.

(viii) The forming of the alloy layer includes sputtering a copper alloy sputtering target material comprising Cu and at least one metal element selected from the group consisting of Ni, Co, Mn, Zn, Mg, Al, Zr, Ti, Fe, and Ag as the additive element, or a copper alloy sputtering target material comprising Cu, and Ni or Mn with a concentration of not less than 1 at % and not more than 5 at % relative to the Cu, to form the alloy layer on the oxide layer, and the forming of the interconnecting layer includes sputtering a copper sputtering target material comprising oxygen free copper with a purity of not less than 3 Nines to form the interconnecting layer on the alloy layer.

(2) According to another embodiment of the invention, an interconnecting structure comprises:

a substrate;

a semiconductor layer formed on the substrate;

a doped semiconductor layer formed on the semiconductor layer, the doped semiconductor layer containing a dopant;

an oxide layer formed in a surface of the doped semiconductor layer;

an alloy layer formed on the oxide layer; and an interconnecting layer formed on the alloy layer.

In the above embodiment (2), the following modifications and changes can be made.

(ix) The semiconductor layer comprises an amorphous silicon layer, the doped semiconductor layer comprises a silicon layer containing the dopant, the oxide layer comprises a silicon oxide layer formed by oxidizing a surface of the doped silicon layer, the alloy layer comprises a Cu alloy layer containing Cu and an additive element, and the interconnecting layer comprises a Cu layer.

POINTS OF THE INVENTION

According to one embodiment of the invention, the surface of a doped semiconductor layer is oxidized by water molecule containing oxidizing gas, so that an interconnecting structure can be formed at a high rate and with no damage to an oxide layer, therefore without the need to form a barrier layer formed of Mo, Ti, or the like used in electronic device interconnections such as liquid crystal panel TFT arrays, and the like, and therefore allowing electronic device production for a short time. That is, the interconnecting structure can be fabricated without forming the barrier layer formed of expensive Mo, Ti, or the like, and the costs for producing electronic devices with the interconnecting structure can therefore be reduced.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
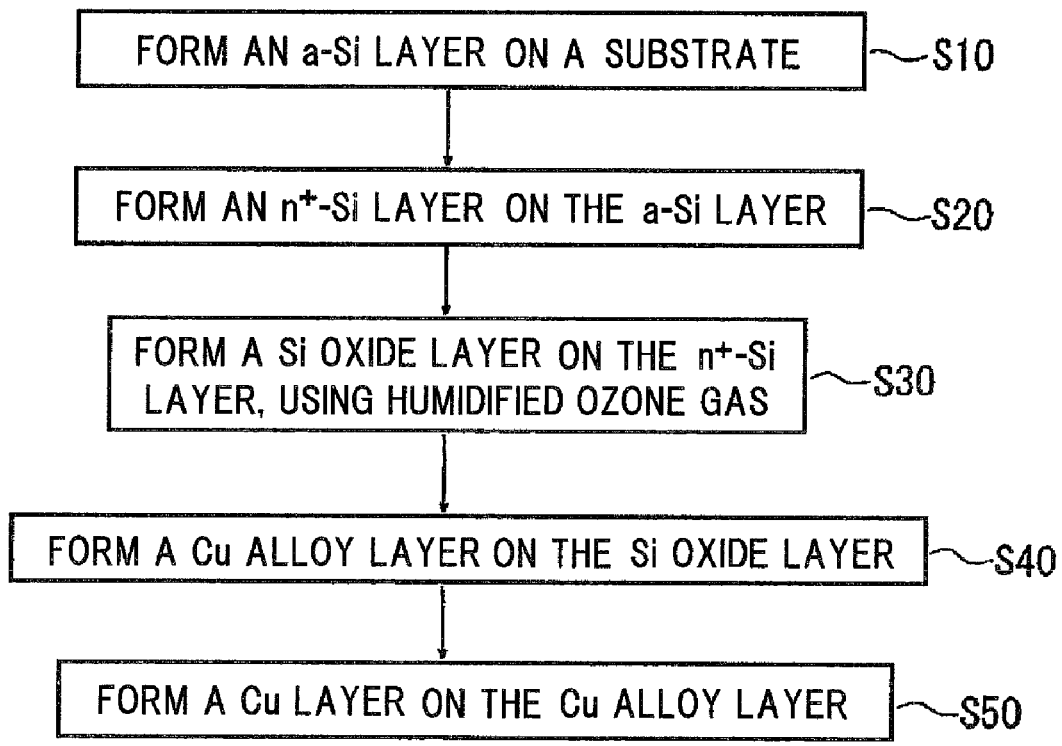
FIG. 1 is a diagram showing a flow of a process for producing an interconnecting structure in an embodiment of the invention.
Figure 2:
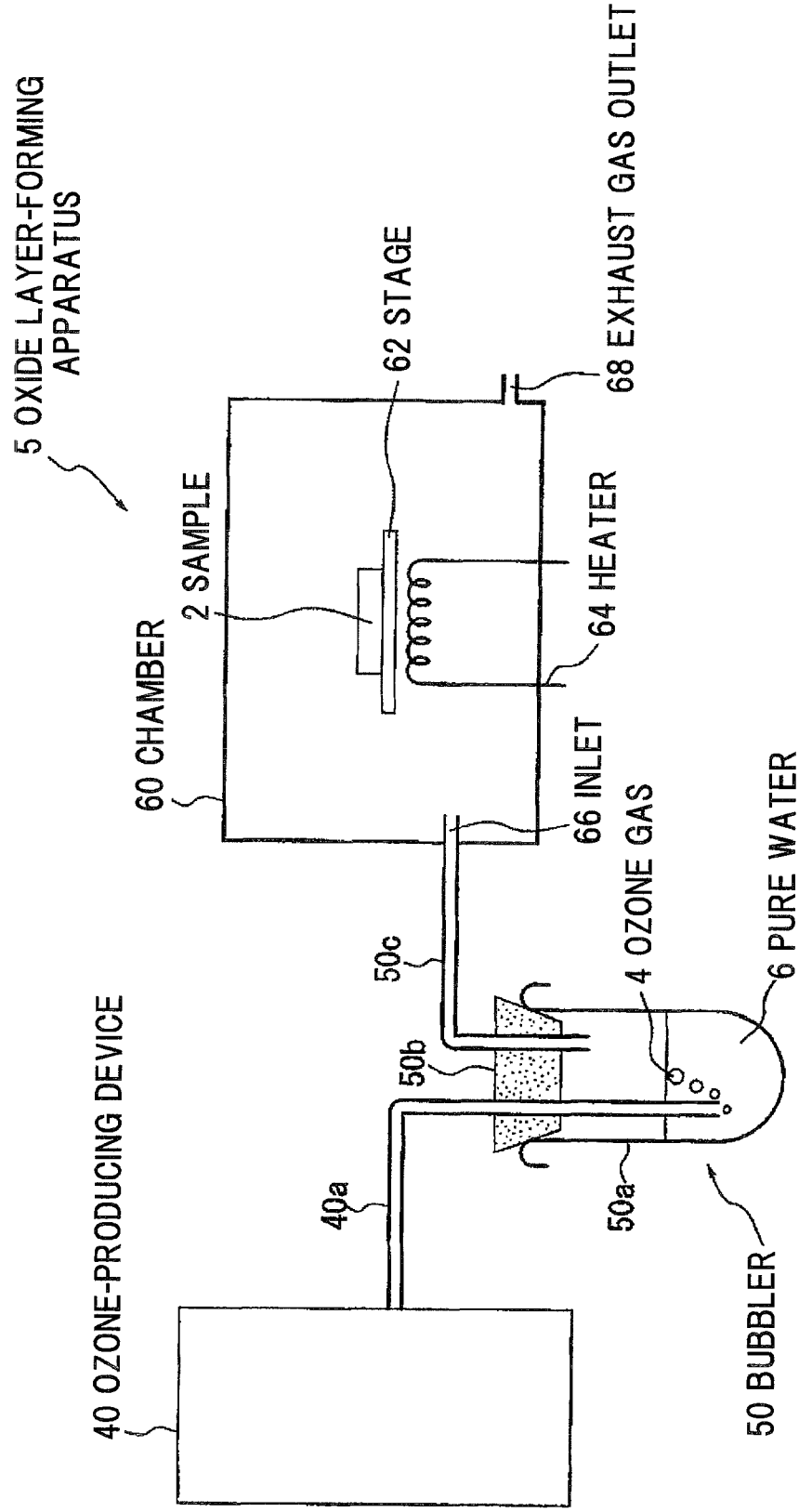
FIG. 2 is a schematic diagram showing an oxide layer forming step involved in the interconnecting structure production process in the present embodiment.
Figure 3:
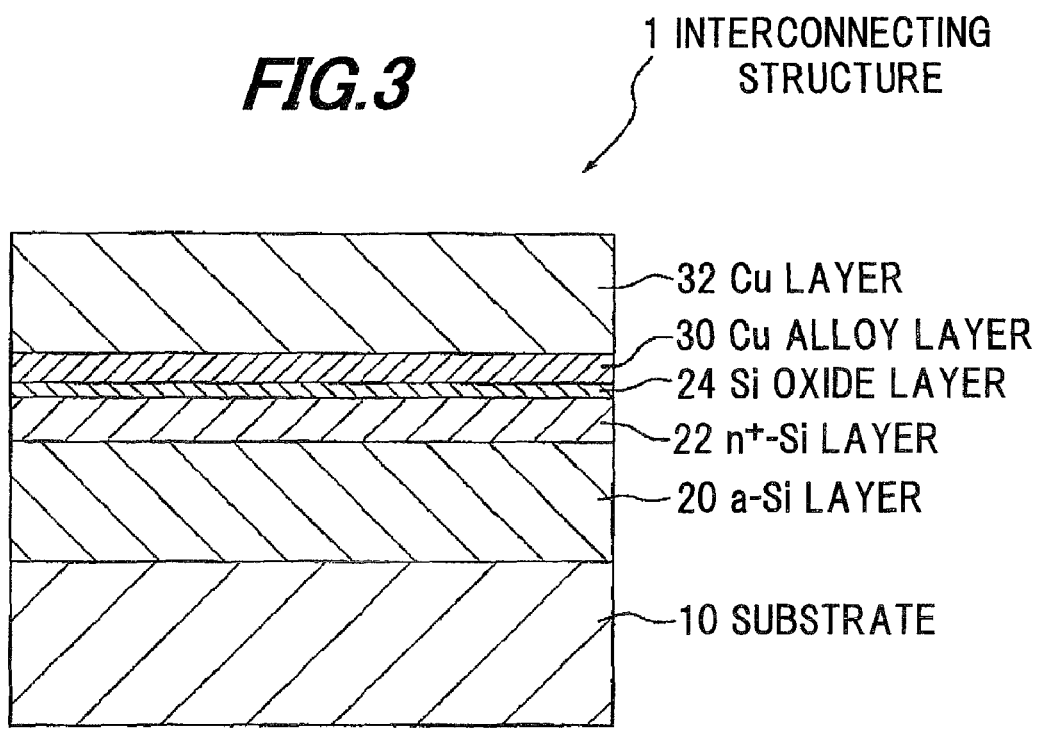
FIG. 3 is an exemplary cross-sectional view showing an interconnecting structure in an embodiment of the invention.

FIG. 1 shows one example of a flow of a process for producing an interconnecting structure in an embodiment of the invention. Also, FIG. 2 schematically shows an oxide layer forming step involved in the interconnecting structure production process in the present embodiment. Further, FIG. 3 is an exemplary cross-sectional view showing an interconnecting structure in an embodiment of the invention.

An interconnecting structure 1 in this embodiment is for use in electronic device interconnections. The interconnecting structure 1 is for use in electronic devices using silicon (Si) semiconductors, such as liquid crystal panel TFT (thin film transistor) devices, silicon solar cells, etc. Its interconnection itself to be formed contains a copper (Cu). One example of the process for fabricating the interconnecting structure 1 is as follows.

Interconnecting Structure 1 Fabrication Process

Semiconductor Layer Forming Step S10

First, a substrate 10 (see FIG. 3) to fabricate a specified electronic device on is prepared (substrate providing step). The substrate 10 may use a glass substrate, for example. Following that, an amorphous silicon layer (herein referred to as "a-Si layer 20" (see FIG. 3)) is formed over the prepared substrate 10 as a semiconductor layer (semiconductor layer forming step S10 (see FIG. 1)). The a-Si layer 20 may be formed by use of a film forming method, for example, by plasma chemical vapor deposition (CVD).

Doped Semiconductor Layer Forming Step S20

Following that, over the a-Si layer 20 is formed a conductive doped semiconductor layer (doped semiconductor layer forming step S20). The doped semiconductor layer may be a doped silicon layer, for example. As examples of its dopant, there are n-type dopants (e.g. arsenic, phosphorus, etc.), or p-type dopants (e.g. boron, aluminum, etc.). For example, a silicon layer doped with a specified concentration of n-type dopant, $n^+$-Si layer 22 (see FIG. 3), is formed over the a-Si layer 20 as the doped semiconductor layer. In the doped semiconductor layer forming step S20, the doped semiconductor layer may also be formed by use of a film forming method, for example, by plasma CVD.

Oxide Layer Forming Step S30

Following that, using an oxide layer forming apparatus 5 as shown in FIG. 2, the surface of the doped semiconductor layer is oxidized to thereby form an oxide layer on that surface. Specifically, the oxide layer is formed by guiding a water molecule containing oxidizing gas over the surface of the doped semiconductor layer, and heating the doped semiconductor layer (oxide layer forming step S30). The oxidizing gas may use a gas for providing "Si" with "O", such as an ozone gas. Also, when the doped semiconductor layer is a Si layer such as the $n^+$-Si layer 22, the resulting oxide layer is a silicon oxide layer (Si oxide layer 24 (see FIG. 3)).

As shown in FIG. 2, the oxide layer forming apparatus 5 comprises an ozone producing device 40 for producing an ozone gas 4, a bubbler 50 for the ozone gas 4 produced by the ozone producing device 40 to be guided therethrough, and a chamber 60 for the ozone gas 4 passed through the bubbler 50 to be guided therethrough. The ozone producing device 40 and the bubbler 50 are connected by a duct 40a, while the bubbler 50 and the chamber 60 are connected by a duct 50c. Also, the chamber 60 is provided with a stage 62 for a sample 2 to be placed thereon, a heater 64 for heating the stage 62, an inlet 66 for the atmosphere gas in the chamber 60 to be guided therethrough, and an exhaust gas outlet 68 for the atmosphere gas in the chamber 60 to be vented therethrough.

Also, the bubbler 50 consists of a solution tank 50a for storing water, and a cover 50b with openings in its portions for the ducts 40a and 50c, respectively, to be guided therethrough into the solution tank 50a. The inside of the solution tank 50a is shielded from outside by the cover 50b. An end of the duct 40a is guided into the water stored in the solution tank 50a, while an end of the duct 50c is fixed to be positioned at a distance above the surface of the water. This allows the gas passed through the duct 40a to be discharged into the water stored in the solution tank 50a. That is, that gas allows the water to bubble, and that gas thereby contains water molecules (bubbling step). The water may use pure water 6 (e.g. pure water with a specific resistance of a few MΩcm).

The oxide layer forming step S30 is more specifically described. First, the sample 2 with the $n^+$-Si layer 22 formed thereon is guided into the chamber 60. The sample 2 is then placed on the stage 62 in such a manner that its surface to form the oxide layer over is exposed in the chamber 60. Subsequently, the ozone gas 4 produced in the ozone producing device 40 is passed through the duct 40a and guided into the bubbler 50. The ozone gas 4 is discharged from the end of the duct 40a into the pure water 6, to thereby absorb water molecules, and move toward the end of the duct 50c. The ozone gas 4 is passed in the pure water 6, thereby containing water molecules, in other words, being humidified.

The humidified ozone gas 4 is passed through the duct 50c and guided into the chamber 60. The sample 2 is heated at a specified temperature (e.g. a temperature of between not less than 200° C. and not more than 300° C.) by the heater 64. The humidified ozone gas 4 then arrives at the heated surface of the sample 2, thereby oxidizing the surface of the sample 2. That is, the sample 2 is placed in the atmosphere of the humidified ozone gas 4, and heated therein, thereby allowing the surface of the sample 2 to be oxidized by the ozone gas 4. This allows the Si oxide layer 24 to be formed without damaging the surface of the sample 2, i.e. the surface of the $n^+$-Si layer 22. The thickness of the Si oxide layer 24 is formed to be within a range of being capable of electrical conduction between the $n^+$-Si layer 22 and a later-described Cu alloy layer 30. For example, the thickness of the Si oxide layer 24 is formed to range between not less than 1 nm and not more than 5 nm.

Here, the pressure within the chamber 60 is held at atmospheric pressure, for example. The humidified ozone gas 4 then forms a steady stream (i.e. a flow of the humidified ozone gas 4 held at a constant flow rate) from the inlet 66 toward the exhaust gas outlet 68. For example, a steady stream of the ozone gas 4 may be formed from the inlet 66 toward the exhaust gas outlet 68, by the ozone producing device 40 steadily discharging the ozone gas 4 at a predetermined pressure. This allows the fresh humidified ozone gas 4 to be steadily fed into the surface of the sample 2, i.e. the surface of the $n^+$-Si layer 22. The thickness of the Si oxide layer 24 may be adjusted by changing the period of time of heating the sample 2. For example, increasing the length of the heating time allows the thickness of the Si oxide layer 24 formed over the $n^+$-Si layer 22 to increase. In this embodiment, the humidified ozone gas 4 is contacted with the surface of the sample 2 for a few minutes, thereby allowing the rate at which the Si oxide layer 24 forms to be on the order of 1 nm (i.e. on the order of a few nm/minute).

Alloy Layer Forming Step S40

Following that, the sample 2 with the Si oxide layer 24 formed therein is taken out from the oxide layer forming apparatus 5. The sample 2 taken out is then guided into a sputtering apparatus, for example. A Cu alloy layer 30 is then formed over the Si oxide layer 24 by sputtering (alloy layer forming step S40). The Cu alloy layer 30 is a layer formed of a Cu alloy composed of a Cu, a specified additive element, and an inevitable impurity, for example. In this embodiment, a copper alloy sputtering target material formed of that Cu alloy is prepared, to form the Cu alloy layer 30 over the Si oxide layer 24 by sputtering.

As the additive element contained in the Cu alloy, there is at least one metal element selected from the group consisting of Ni, Co, Mn, Zn, Mg, Al, Zr, Ti, Fe, and Ag, for example. That is, the Cu alloy in this embodiment is composed of a Cu, at least one metal element of these metal elements, and an inevitable impurity. The Cu alloy may be made up to contain a Cu, a plurality of metal elements included in these metal elements, and an inevitable impurity.

Also, the Cu alloy forming the Cu alloy layer 30 may particularly use a Cu alloy composed of a Cu, a concentration of Ni (nickel) or Mn (manganese) of between not less than 1 at % and not more than 5 at % added to the Cu, and an inevitable impurity. The resistivity of the Cu alloy containing a concentration of Ni or Mn of between not less than 1 at % and not more than 5 at % is higher than the resistivity of a pure Cu, 2 μΩcm, and the resistivity of a pure Al (aluminum), 3 μΩcm, and lower than the resistivity of a Mo (molybdenum), of the order of 20 μΩcm.

Interconnecting Layer Forming Step S50

Following that, a Cu layer 32 is formed over the Cu alloy layer 30 as a low resistivity interconnecting layer having a resistivity lower than the resistivity of at least an Al (interconnecting layer forming step S50). This results in the interconnecting structure 1 in this embodiment. In the interconnecting structure 1 in this embodiment, the Cu alloy layer 30 and the Cu layer 32 constitute a stacked layer electrode structure.

Here, the Cu layer 32 is a layer formed of a pure Cu, for example. In this embodiment, a copper alloy sputtering target material formed of that pure Cu is prepared, to form the Cu layer 32 over the Cu alloy layer 30 by sputtering. The pure Cu may use an oxygen free copper whose purity is not less than 99.9% (3 Nines). Also, the pure Cu may use a high purity oxygen free copper, such as an oxygen free copper whose purity is not less than 99.99% (4 Nines), an oxygen free copper whose purity is not less than 99.999% (5 Nines), or the like.

Diffusion Barrier Layer Formation

Also, a diffusion barrier layer may further be formed by heating the interconnecting structure 1 at a temperature of between not less than 200° C. and not more than 300° C., to make the additive element contained in the Cu alloy layer 30 dense (diffusion barrier layer forming step). The diffusion barrier layer is formed as follows. The formation of the Cu alloy layer 30 and the Cu layer 32 is first followed by heat treatment of the interconnecting structure 1 at not less than about 200° C. and not more than about 300° C. in a TFT fabricating process (e.g. its insulating film forming step), for example. This heat treatment allows the additive element contained in the Cu alloy layer 30 to move to the interface between the Si oxide layer 24 and the Cu alloy layer 30, and thereby become dense in the interface therebetween. The oxygen in the Si oxide layer 24 and that additive element then form an oxide layer with that additive element. This oxide layer is the diffusion barrier layer in this embodiment. The interconnecting structure 1 after the formation of the Cu alloy layer 30 and the Cu layer 32 may directly be used in a TFT fabricating process (that is, the interconnecting structure 1 may, without the heat treatment at not less than about 200° C. and not more than about 300° C. as mentioned above, be used in a TFT fabricating process). In this case, as one example, the use of the heat treatment at not less than about 200° C. and not more than about 300° C. in the CVD step of forming a SiN insulating layer involved in the TFT fabricating process allows the diffusion barrier layer to automatically form in the interconnecting structure 1.

For example, the Cu alloy layer 30 is first formed by the Cu alloy added the additive element to a Cu. The Cu alloy layer 30 is then heated. This heat treatment allows the skin effect to move the additive element in the Cu alloy layer 30 to the interface between the Si oxide layer 24 and the Cu alloy layer 30. The concentration of the additive element in the Cu alloy layer 30 then decreases, while the concentration of the additive element in that interface increases. The additive element made dense in that interface reacts with the oxygen in the Si oxide layer 24 to form an oxide with that additive element. In the case where the diffusion barrier layer is formed, the additive element to use for the Cu alloy layer 30 is therefore preferred which allows the resultant diffusion barrier layer to have excellent heat resistance, and which tends to move to the interface between the Si oxide layer 24 and the Cu alloy layer 30.

The diffusion barrier layer inhibits the Cu diffusion into the n$^+$-Si layer 22. The diffusion barrier layer reinforces the function, provided by the Si oxide layer 24, of inhibiting the Cu from diffusing into the n$^+$-Si layer 22. Further, the formation of the diffusion barrier layer at the interface between the Si oxide layer 24 and the Cu alloy layer 30 allows enhancement of the adhesion between the Si oxide layer 24 and the Cu alloy layer 30. Since the Si oxide layer 24 is then a few nm thick, electrical conduction between the Si oxide layer 24 and the Cu alloy layer 30 can be ensured by a tunneling current. The SiO$_2$ of the Si oxide layer 24 and the Cu alloy constituent of the Cu alloy layer 30 may react to thereby form a layer formed of a composite oxide (herein referred to as "composite oxide layer") between the Si oxide layer 24 and the Cu alloy layer 30, in which case that composite oxide layer permits electrical conduction.

Interconnecting Structure 1

Here is described FIG. 3. Specifically, FIG. 3 is an exemplary cross-sectional view showing an interconnecting structure formed according to the interconnecting structure production method described in FIGS. 1 and 2. The interconnecting structure 1 in this embodiment includes the substrate 10, the a-Si layer 20 formed over the substrate 10 as a semiconductor layer, the n$^+$-Si layer 22 formed over the a-Si layer 20 as a doped semiconductor layer, the Si oxide layer 24 formed over the n$^+$-Si layer 22 as an oxide layer, the Cu alloy layer 30 formed over the Si oxide layer 24 as an alloy layer, and the Cu layer 32 formed over the Cu alloy layer 30 as an interconnecting layer. In the case where the interconnecting structure 1 includes the diffusion barrier layer, the diffusion barrier layer is formed to have a specified thickness at the interface between the Si oxide layer 24 and the Cu alloy layer 30.

Advantages of the Embodiment

Since the surface of the n$^+$-Si layer 22 is oxidized by the humidified ozone gas 4, the interconnecting structure 1 in this embodiment can be formed at a high rate and with no damage to the Si oxide layer 24, therefore without the need to form a barrier layer formed of Mo, Ti, or the like used in electronic device interconnections such as liquid crystal panel TFT arrays, and the like, and therefore allowing electronic device production for a short time. That is, the interconnecting structure 1 can be fabricated without forming a barrier layer formed of expensive Mo, Ti, or the like, and the costs for producing electronic devices with the interconnecting structure 1 in this embodiment can therefore be reduced.

Also, with the interconnecting structure 1 in this embodiment, since the humidified ozone gas 4 is steadily fed into the surface of the n$^+$-Si layer 22 to oxidize the surface of the n$^+$-Si layer 22 for an appropriate time, the Si oxide layer 24 can be formed to cover the entire surface of the n$^+$-Si layer 22. This allows the resulting Si oxide layer 24 to exhibit the sufficient diffusion barrier property, compared to, for example, reactive sputtering using a mixture of Ar and O$_2$ gases, which may cause portion of the surface of the doped semiconductor layer to form no oxide layer, and which may therefore cause the element in the doped semiconductor layer to diffuse from that portion.

Also, since the interconnecting structure 1 in this embodiment includes the interconnection of the Cu layer 32 having a resistance lower than Al interconnections, the use of the interconnecting structure 1 for TFT arrays allows reductions of their design costs required for large-sized and high-definition liquid crystal panels.

Further, the interconnecting structure 1 in this embodiment includes the interconnection with the Cu layer 32 stacked over the Cu alloy layer 30. It is therefore possible to realize the interconnection having a resistance lower than interconnections formed of an Al/Mo stack, and interconnections formed of a Cu/Mo stack, where that interconnection, the interconnections formed of the Al/Mo stack, and the interconnections formed of the Cu/Mo stack, have the same cross sectional area, for example.

EXAMPLES

Below are described interconnecting structures in Examples 1 and 2 formed based on the embodiment, and an interconnecting structure in Comparative Example 1. The difference between Examples 1 and 2, and Comparative Example 1 is resultant oxide film thickness only. Specifically, the interconnecting structures in Examples 1 and 2, and Comparative Example 1 are fabricated as follows.

Example 1

First, a glass substrate is prepared as the substrate 10. Following that, over the glass substrate is formed an approximately 200 nm thick film of a-Si layer 20, by plasma CVD using a SiH$_4$ gas as its source gas. This a-Si layer 20 is a hydrogenated amorphous silicon layer (a-Si:H layer) containing hydrogen in the source gas. The a-Si:H layer is also used in liquid crystal panel manufacture. Following that, over the a-Si layer 20 is formed a 50 nm thick film of conductive n$^+$-type a-Si layer 22, which is doped with phosphorus, by plasma CVD using SiH$_4$ and PH$_3$ gases as its source gas.

Following that, using the oxide layer forming apparatus 5 as shown in FIG. 2, an oxide layer 24 is formed in the surface of the n$^+$-type a-Si layer 22. Specifically, a sample 2 with the n$^+$-type a-Si layer 22 formed therein is first placed on the stage 62 in the chamber 60. Subsequently, the ozone gas 4 produced by the ozone producing device 40 is guided into the bubbler 50 with the pure water 6 stored therein, to humidify the ozone gas 4 by bubbling. Following that, the humidified ozone gas 4 is guided into the chamber 60 whose internal pressure is held at atmospheric pressure. A steady stream of the humidified ozone gas 4 is then formed, followed by heating the sample 2 at 250° C.

The sample 2 is heated in the stream of the humidified ozone gas 4, to thereby oxidize the surface of the n$^+$-type a-Si layer 22. Specifically, the sample 2 is heated for 3 minutes, thereby resulting in a 1 nm thick oxide film 24 being formed in the surface of the n$^+$-type a-Si layer 22. The oxide film thickness is measured by use of a spectrometric ellipsometer.

Following that, over the oxide film 24 is formed a 100 nm thick Cu—Ni alloy layer 30. The Cu—Ni alloy layer 30 is formed by sputtering using a Cu-5 at % Ni alloy target material. Subsequently, over the Cu—Ni alloy layer 30 is formed a 200 nm thick pure Cu layer 32. The pure Cu layer 32 is formed by sputtering using a pure Cu target material formed of a 4 Nines purity oxygen free copper.

Example 2

In Example 2, the interconnecting structure is fabricated in the same manner, except that the sample 2 is heated in the stream of the humidified ozone gas 4 for 22 minutes, thereby resulting in a 5 nm thick oxide film 24 being formed in the surface of the n$^+$-type a-Si layer 22.

Comparative Example 1

In Comparative Example 1, the interconnecting structure is fabricated in the same manner, except that the sample 2 is heated in the stream of the humidified ozone gas 4 for 58 minutes, thereby resulting in a 10 nm thick oxide film 24 being formed in the surface of the n+-type a-Si layer 22.

Diffused Condition Analysis

FIGS. 4 to 9 respectively show the results of XPS analysis of the interface between the n+ type a-Si layer 22 and the Cu—Ni alloy layer 30.

Figure 4:
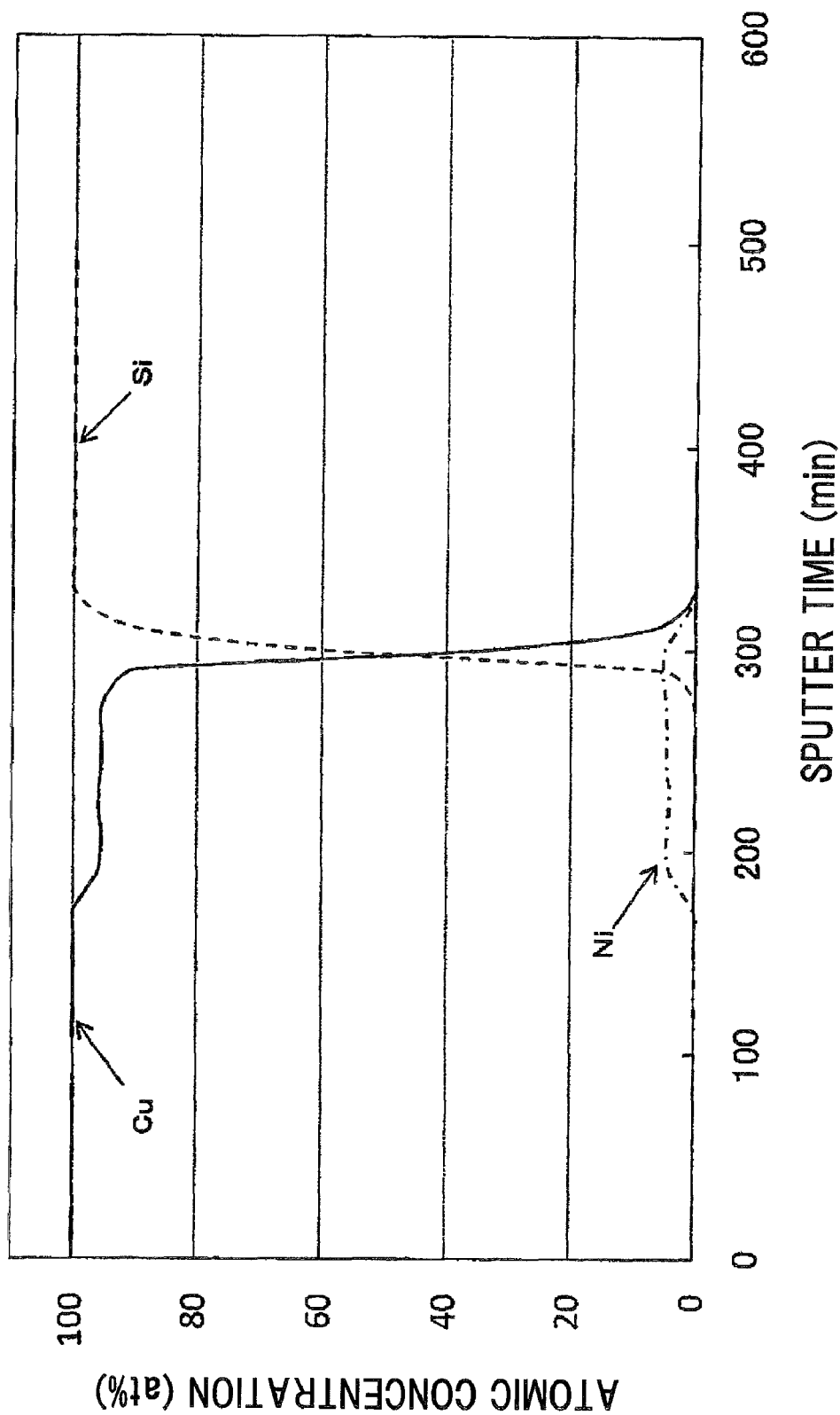
FIG. 4 is a diagram showing a result of XPS analysis of an interface between an n+ type a-Si layer and a Cu—Ni alloy layer in Example 1.
Figure 5:
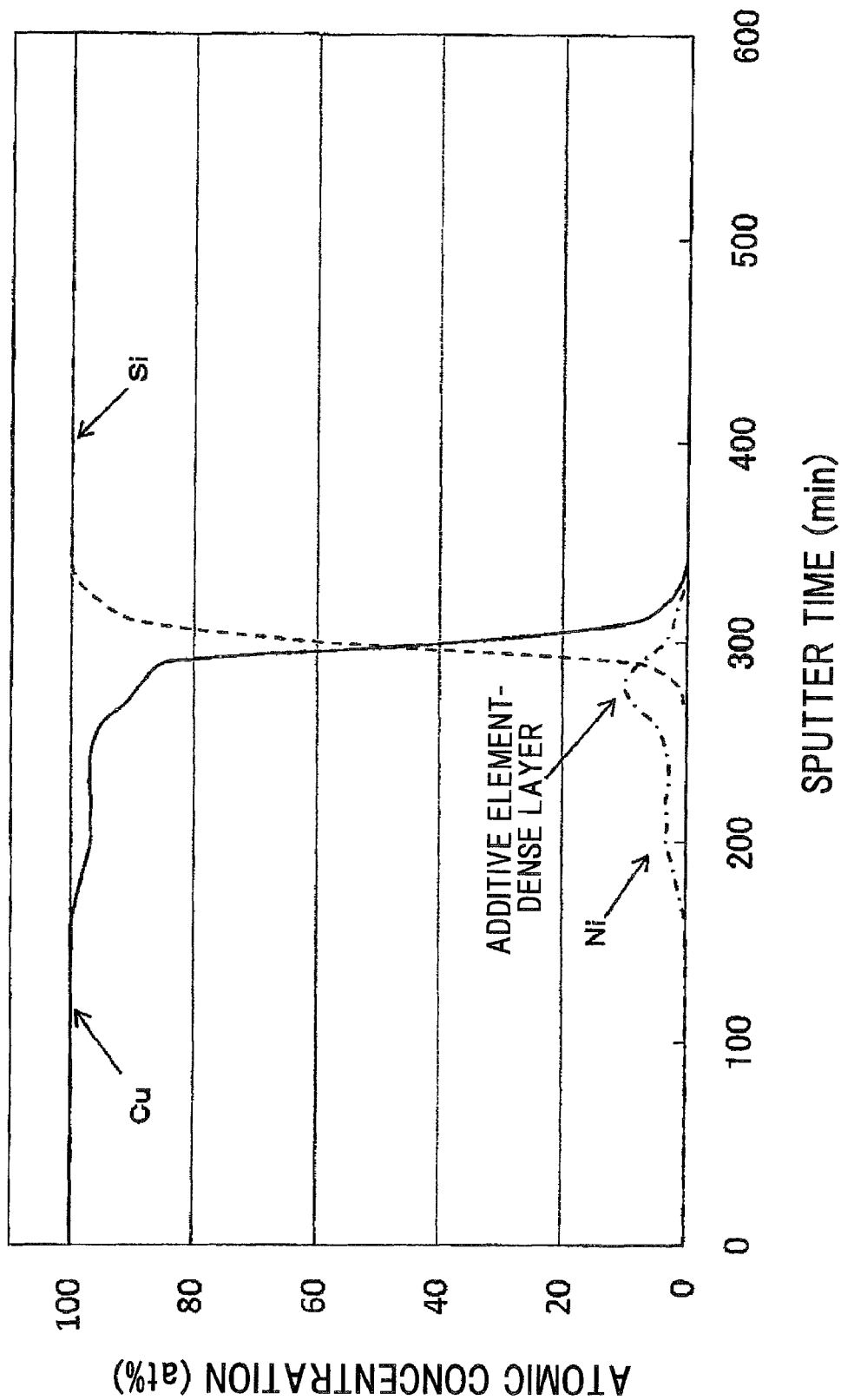
FIG. 5 is a diagram showing a result of XPS analysis of an interface between an n+ type a-Si layer and a Cu—Ni alloy layer in Example 1.
Figure 6:
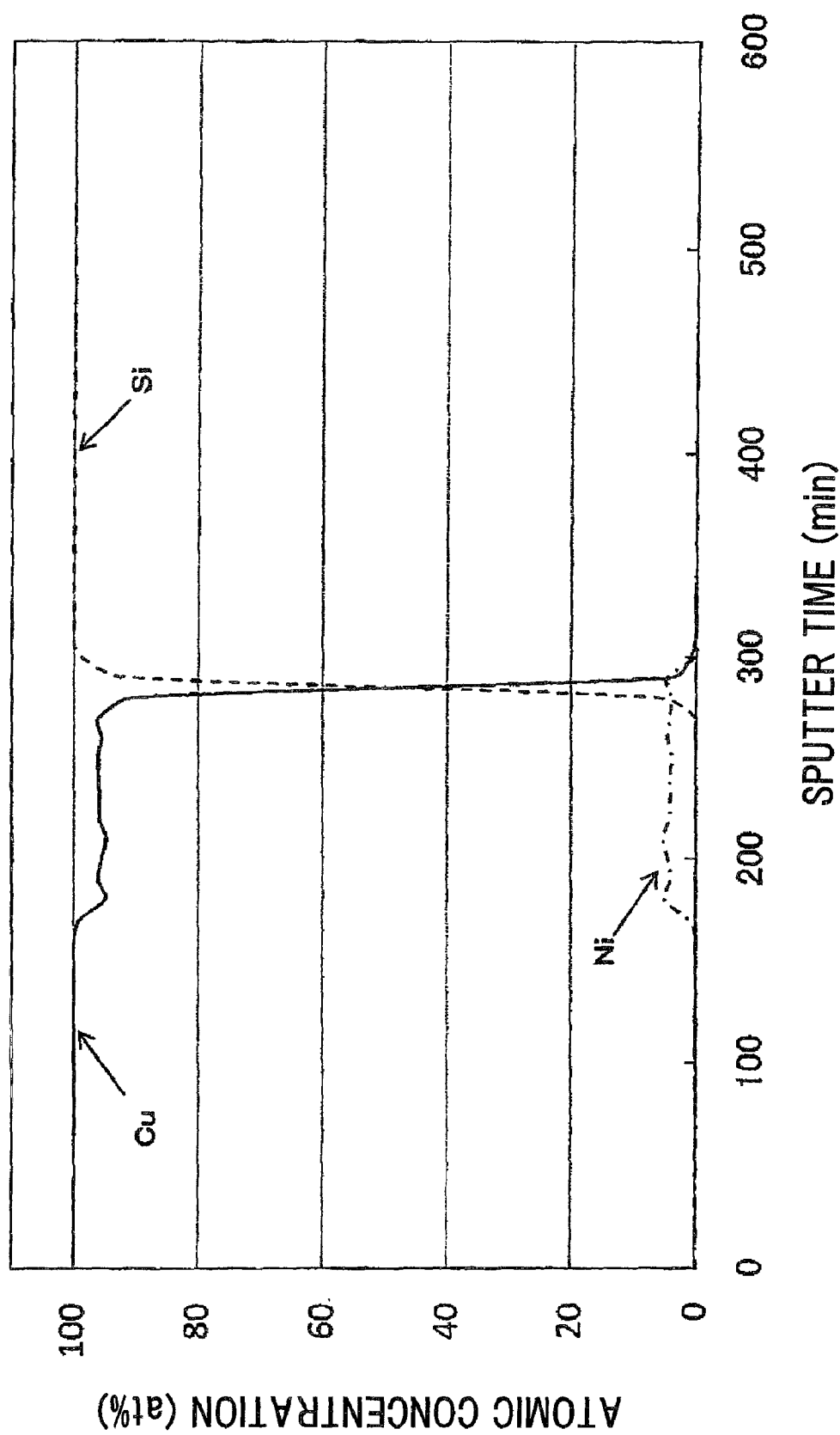
FIG. 6 is a diagram showing a result of XPS analysis of an interface between an n+ type a-Si layer and a Cu—Ni alloy layer in Example 2.
Figure 7:
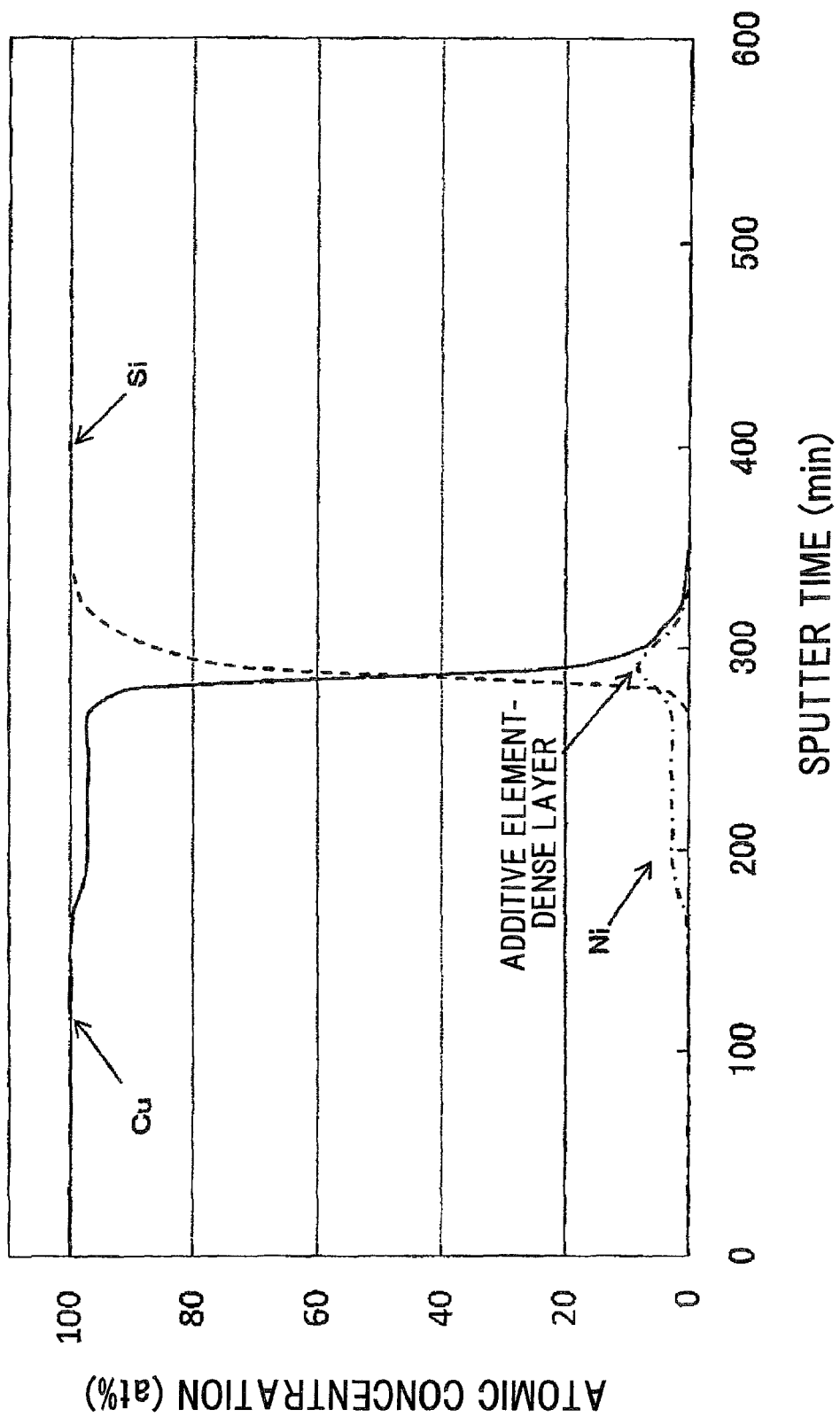
FIG. 7 is a diagram showing a result of XPS analysis of an interface between an n+ type a-Si layer and a Cu—Ni alloy layer in Example 2.
Figure 8:
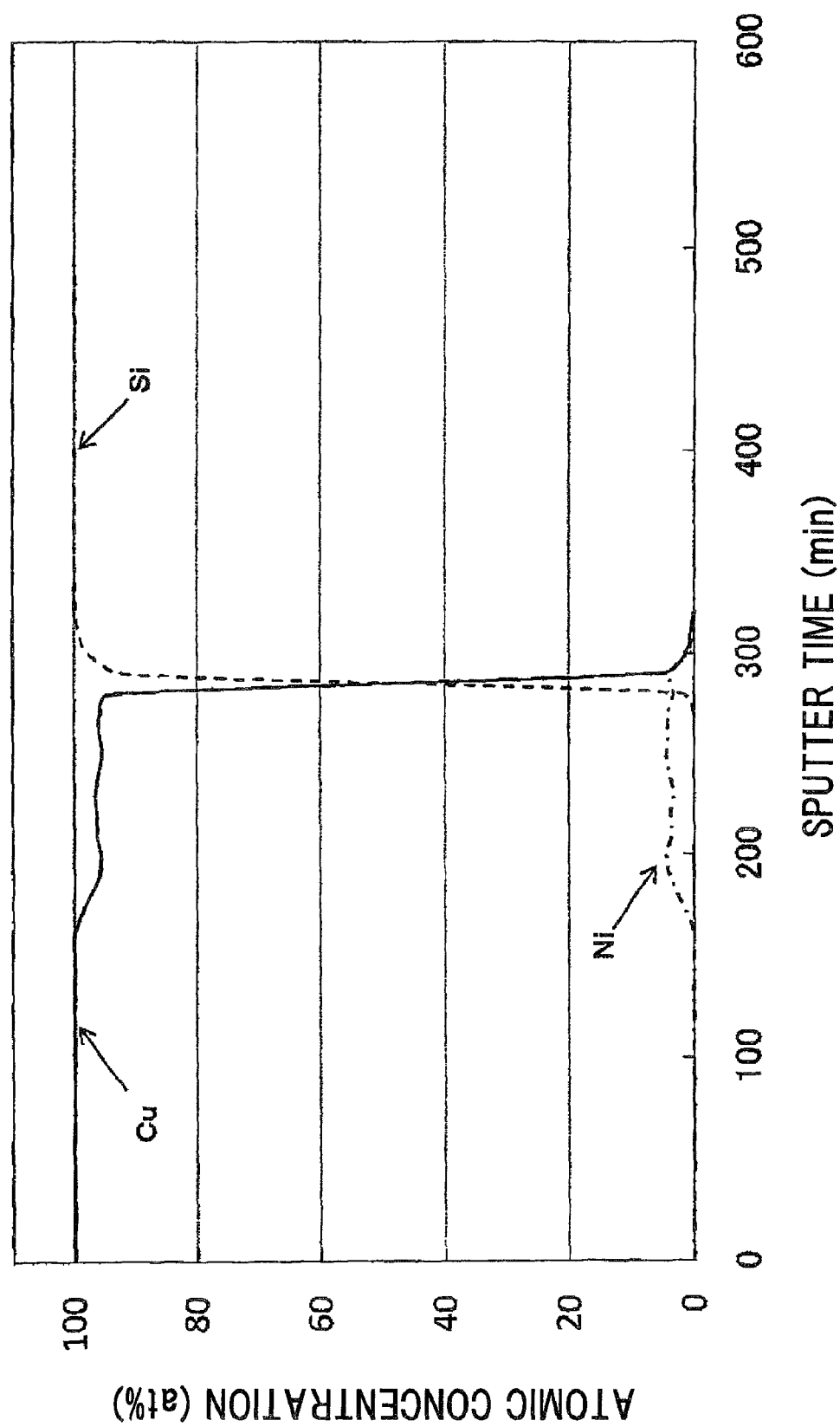
FIG. 8 is a diagram showing a result of XPS analysis of an interface between an n+ type a-Si layer and a Cu—Ni alloy layer in Comparative Example 1.
Figure 9:
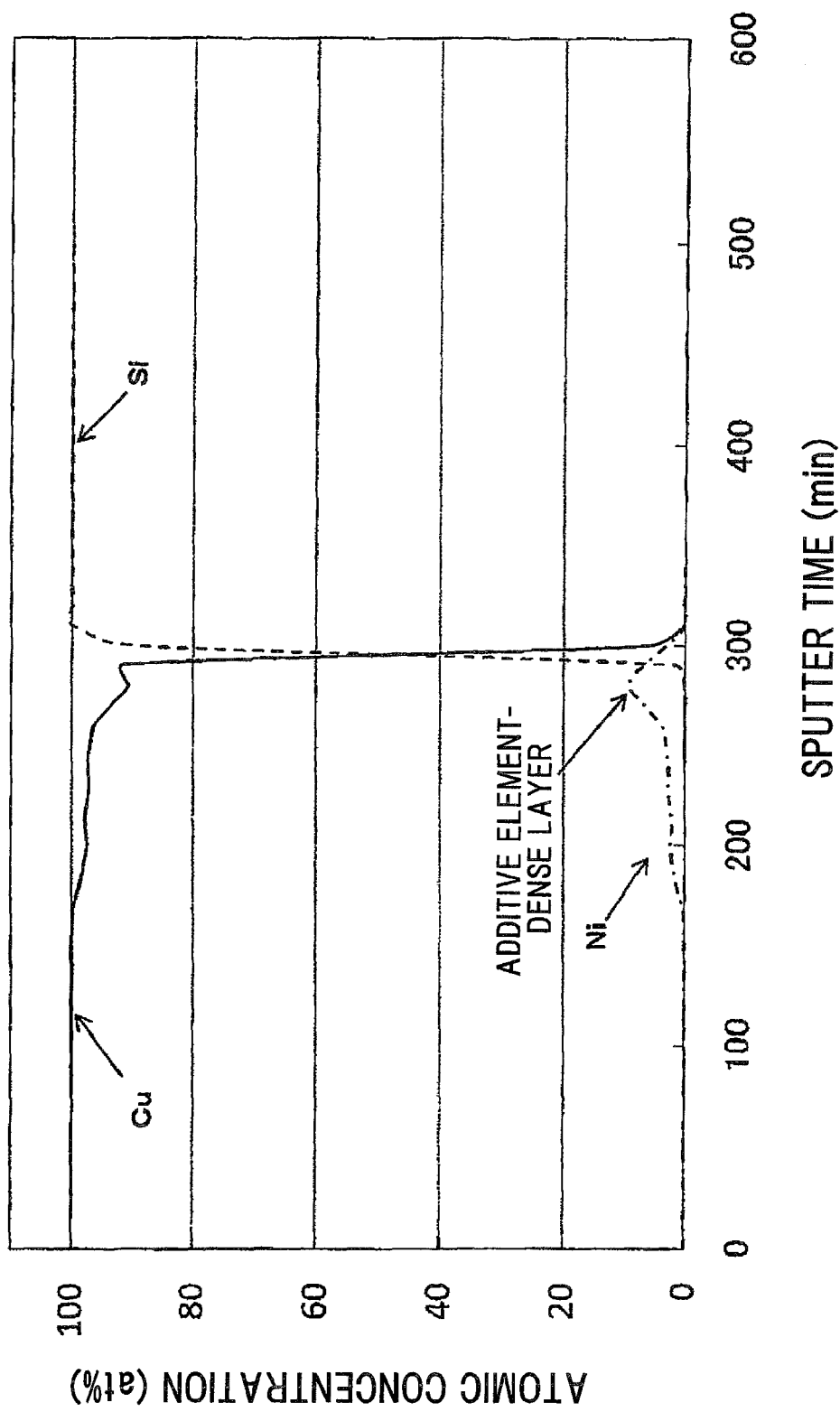
FIG. 9 is a diagram showing a result of XPS analysis of an interface between an n+ type a-Si layer and a Cu—Ni alloy layer in Comparative Example 1.

Specifically, the above fabricated interconnecting structures in Examples 1 and 2, and Comparative Example 1 are heated in a vacuum at a temperature of 300° C. for 1 hour, which is a simulated heating temperature in a $SiN_x$ insulating film forming step involved in a liquid crystal panel TFT structure fabricating process. Depth analysis of the interconnecting structures before and after the heat treatment is then implemented by X-ray photoelectron spectroscopy (XPS). That is, FIG. 4 shows the result of the XPS analysis of the interface between the n+ type a-Si layer 22 and the Cu—Ni alloy layer 30 before the heat treatment of the interconnecting structure in Example 1, while FIG. 5 shows the result of the XPS analysis of the interface between the n+ type a-Si layer 22 and the Cu—Ni alloy layer 30 after the heat treatment of the interconnecting structure in Example 1. Also, FIG. 6 shows the result of the XPS analysis of the interface between the n+ type a-Si layer 22 and the Cu—Ni alloy layer 30 before the heat treatment of the interconnecting structure in Example 2, while FIG. 7 shows the result of the XPS analysis of the interface between the n+ type a-Si layer 22 and the Cu—Ni alloy layer 30 after the heat treatment of the interconnecting structure in Example 2. Further, FIG. 8 shows the result of the XPS analysis of the interface between the n+ type a-Si layer 22 and the Cu—Ni alloy layer 30 before the heat treatment of the interconnecting structure in Comparative Example 1, while FIG. 9 shows the result of the XPS analysis of the interface between the n+ type a-Si layer 22 and the Cu—Ni alloy layer 30 after the heat treatment of the interconnecting structure in Comparative Example 1.

As shown in FIGS. 4 to 9, for all of the interconnecting structures in Examples 1 and 2, and Comparative Example 1, no interdiffusion between the n+ type a-Si layer 22 and the Cu—Ni alloy layer 30 in the interface therebetween is observed before and after the heat treatment, and their diffusion barrier property is verified. After the heat treatment, it is observed that the Ni becomes dense in that interface, as indicated as "additive element dense layer" in FIGS. 5, 7, and 9. The additive element dense layer is considered to serve to aid the diffusion barrier property of the Si oxide film 24. Because the XPS analysis is performed with the film surface being ground by sputtering, the ground surface becomes rough. In the respective analysis profiles of FIGS. 4 to 9, the "roll-off" is therefore observed. From the "roll-off" in FIGS. 4 to 9, slight interdiffusion seems at a glance to occur, but in the actual interconnecting structures, the composition distribution at the interface is considered as changing more abruptly than in the analysis profiles observed.

Also, for each of the interconnecting structures in Examples 1 and 2, and Comparative Example 1, the heat treatment is followed by removal of the pure Cu layer 32 and the Cu alloy layer 30 with a phosphate Cu etchant. The sheet resistance of the exposed oxide layer 24 is then measured with a four terminal method. For all of the interconnecting structures in Examples 1 and 2, and Comparative Example 1, it has been verified that the sheet resistance of the oxide layer 24 results in an over range at a maximum range of 5 MΩ.

Ohmic Contact Property Between the a-Si Layer 22, and the Pure Cu Layer 32 and the Cu—Ni Alloy Layer 30

Figure 10:
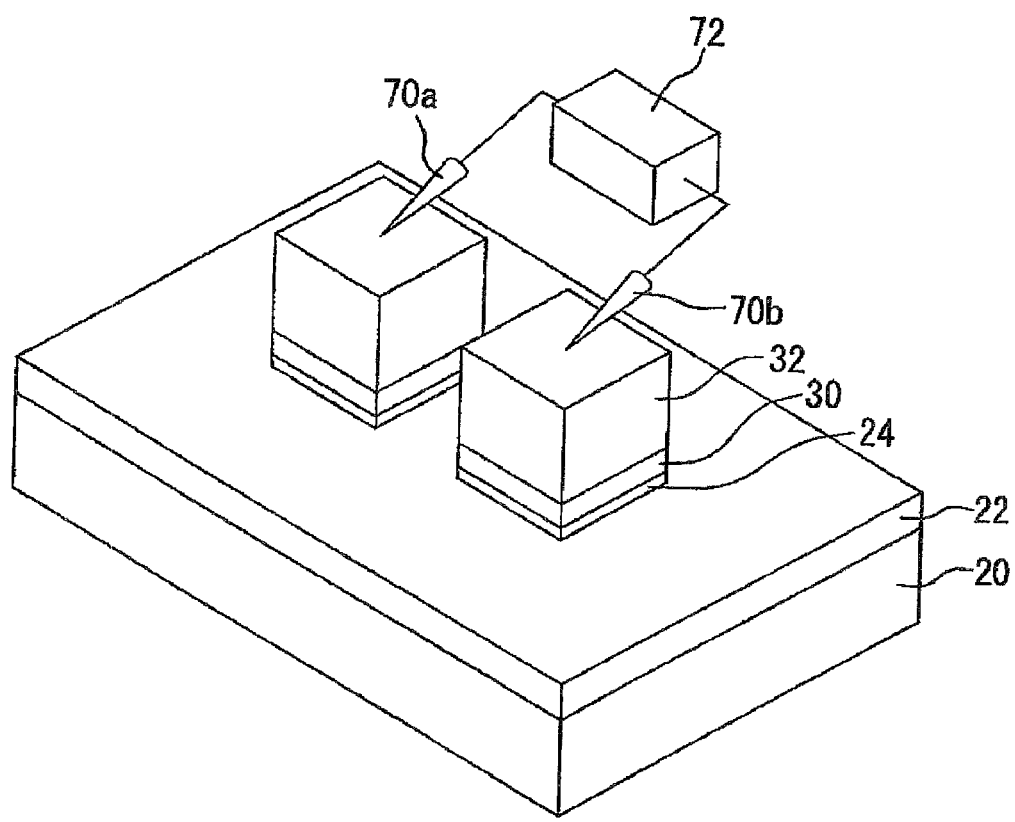
FIG. 10 is a schematic diagram showing a test for evaluating an ohmic contact property.
Figure 11:
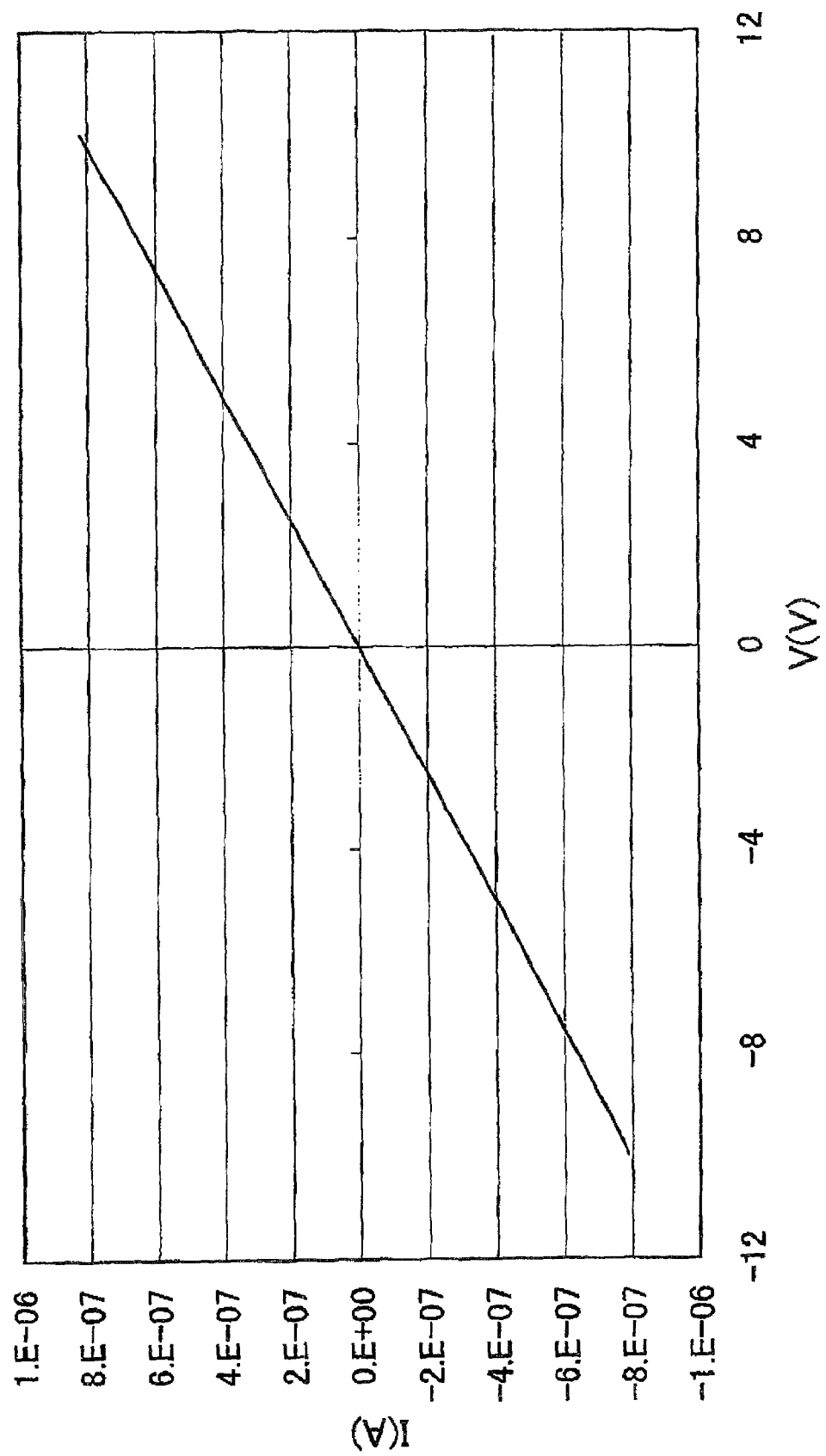
FIG. 11 is a diagram showing a V-I (voltage-current) characteristic of an interconnecting structure in Example 1.
Figure 12:
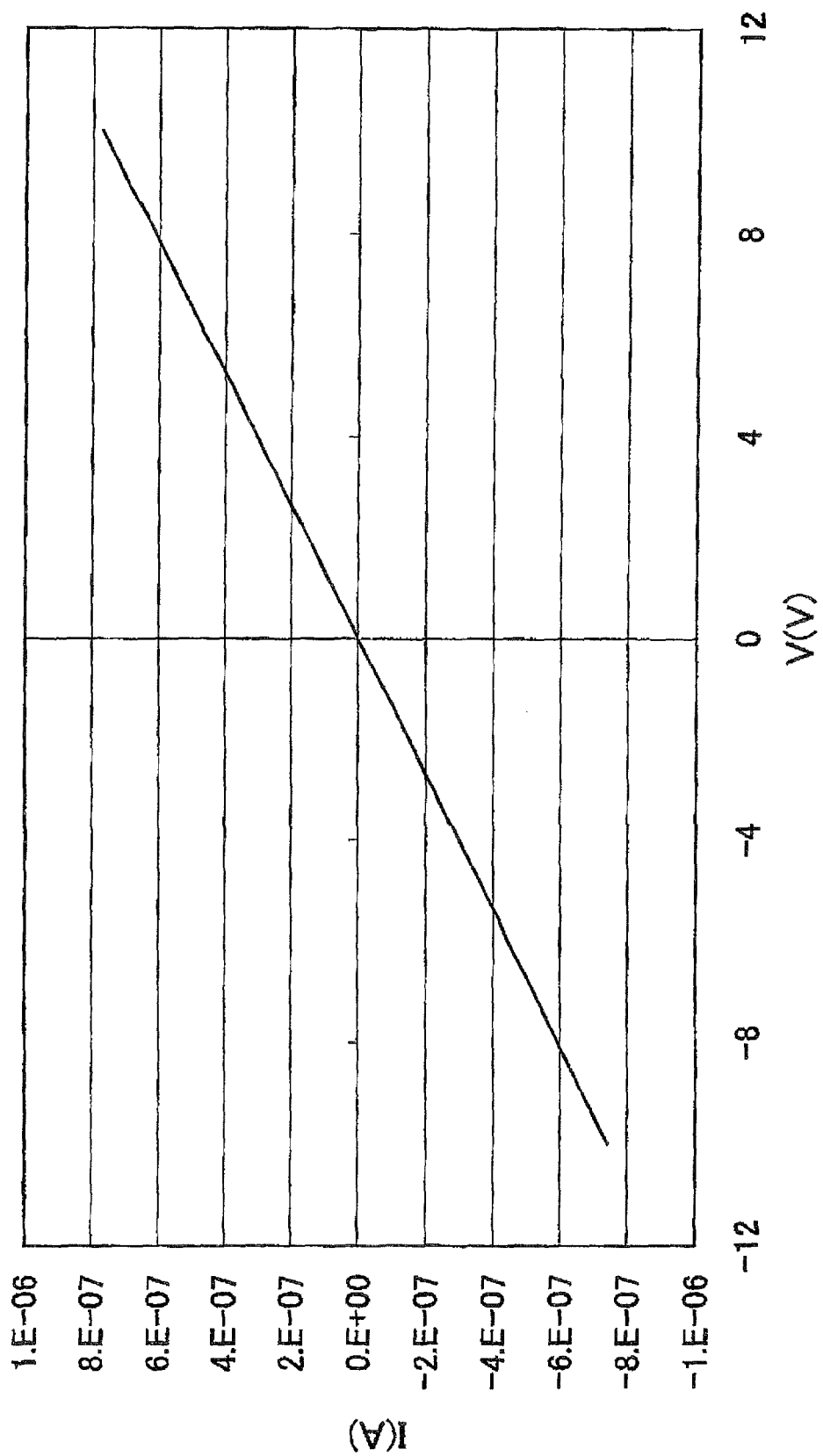
FIG. 12 is a diagram showing a V-I characteristic of an interconnecting structure in Example 2.
Figure 13:
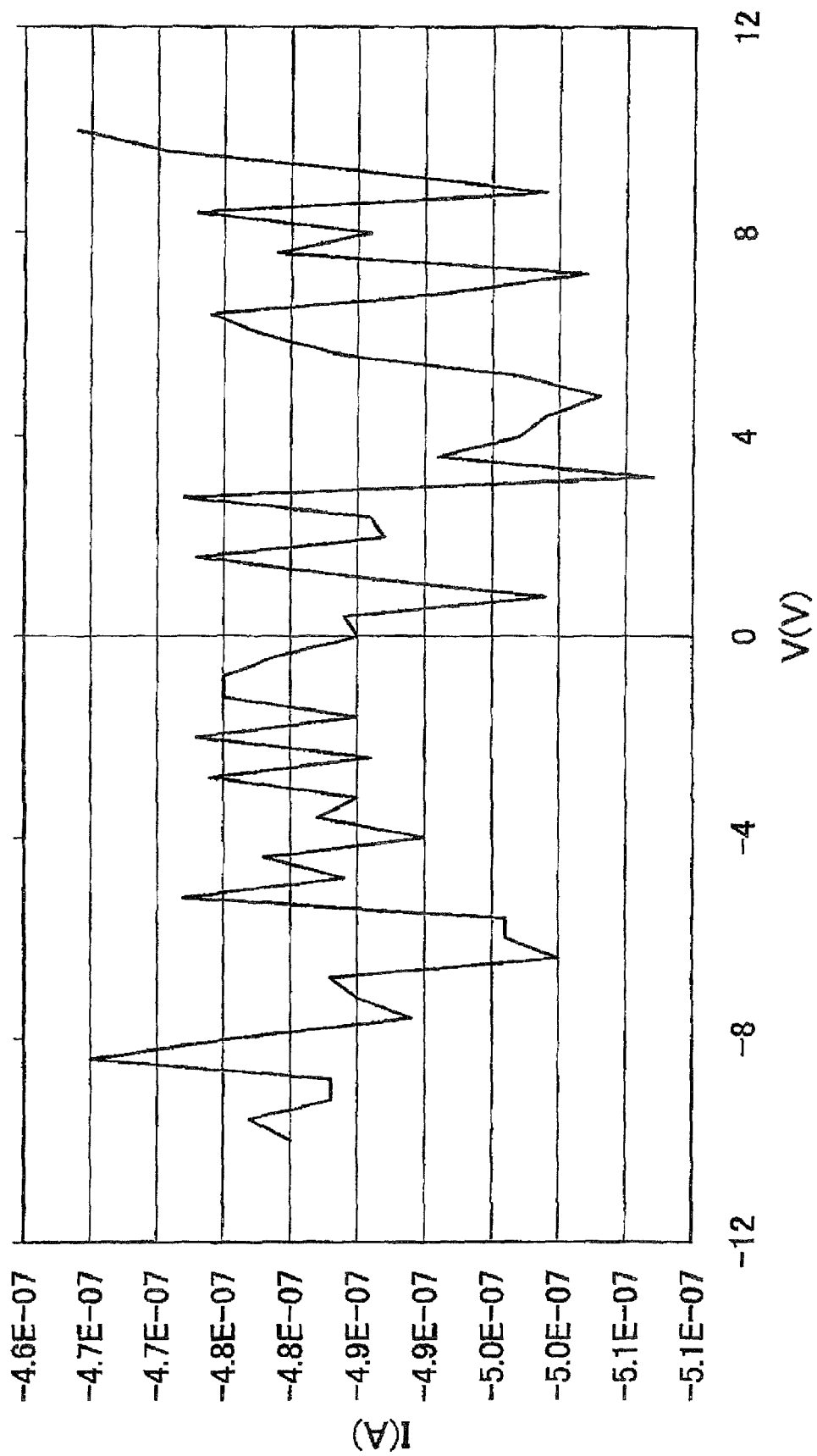
FIG. 13 is a diagram showing a V-I characteristic of an interconnecting structure in Comparative Example 1.

FIG. 10 schematically shows a test for evaluating an ohmic contact property, and FIGS. 11 to 13 show V-I (voltage-current) characteristics of interconnecting structures in Examples 1 and 2, and Comparative Example 1, respectively.

Samples for evaluating an ohmic contact property are fabricated as follows. First, using photolithography, a resist pattern is formed prior to heat treatment, for each of the interconnecting structures in Examples 1 and 2, and Comparative Example 1. The resist pattern has 3 mm square patterns spaced 1 mm apart. Following that, using the formed resist pattern as a mask, the pure Cu layer 32 and the Cu—Ni alloy layer 30 are removed by wet etching. This results in a shape in which 3 mm square pads (herein referred to as "electrode pads") formed of the pure Cu layer 32 and the Cu—Ni alloy layer 30 are spaced 1 mm apart, for each of Examples 1 and 2, and Comparative Example 1.

Following that, although it is determined that the Cu alloy constituent does not diffuse into the n+ type a-Si layer 22 as described in the "diffused condition analysis" above, because in the subsequent heat treatment step the Si oxide layer 24 and the Cu alloy constituent can form a conductive composite oxide, the oxide layer 24 between the electrode patterns is removed. Following that, the 300° C. heat treatment is performed in a vacuum for 1 hour. This results in the samples for evaluating an ohmic contact property. The ohmic contact property evaluation is implemented with probes 70a and 70b contacting the two electrode pads, respectively, and by using a source measure unit 72 with a power supply and a meter integral with each other, permitting electrical conduction between the two electrodes, and measuring the V-I (voltage-current) characteristic of the a-Si layer 22 therebetween.

Referring to FIGS. 11 and 12, the interconnecting structures in Examples 1 and 2 exhibit the linear V-I characteristic. It is therefore shown that the interconnecting structures in Examples 1 and 2 give the ohmic contact between the a-Si layer 22 and the Cu—Ni alloy layer 30. Referring to FIG. 13, on the other hand, it is shown that the interconnecting structure in Comparative Example 1 gives no electrical conduction, and therefore no ohmic contact between the a-Si layer 22 and the Cu—Ni alloy layer 30.

Pure Cu Layer 32 Resistivity

After the heat treatment, for each of the samples for evaluating an ohmic contact property fabricated in the "ohmic contact property between the a-Si layer 22, and the pure Cu layer 32 and the Cu—Ni alloy layer 30" above, the resistivity of the pure Cu layer 32 is measured with a van der Pauw method. It is shown that Examples 1 and 2, and Comparative Example 1 all have a resistivity of the order of 2.0 μΩcm, which is substantially the same as a resistivity of a pure Cu. Table 1 shows the summarized results of the ohmic contact property evaluation, and the resistivity of the pure Cu layer 32, for the interconnecting structures in Examples 1 and 2, and Comparative Example 1.

TABLE 1

|  | Si oxide layer thickness (nm) | Oxide layer forming time (min) | Pure Cu layer resistivity (μΩcm) | Ohmic contact property |
| --- | --- | --- | --- | --- |
| Example 1 | 1 | 3 | 2.1 | Good |
| Example 2 | 5 | 22 | 2.0 | Good |
| Comparative Example 1 | 10 | 58 | 2.0 | Poor |

Diffusion Barrier Property, Electrical Conduction Property, and Adhesion Property Table 2 shows the results of comparing the diffusion barrier property, the electrical conduction property, and the adhesion property of the oxide film 24.

TABLE 2

| | Layer structure over n+-Si layer with 5 nm-thick oxide film | Diffusion barrier property | Electrical conduction property | Adhesion property |
|---|---|---|---|---|
| Example 3 | Pure Cu | Good (over range, >5MΩ) | Good (13MΩ) | Good |
| Example 4 | Cu-1 at % Ni | Good (over range, >5MΩ) | Good (10MΩ) | Good |
| Example 5 | Cu-5 at % Ni | Good (over range, >5MΩ) | Good (11MΩ) | Good |
| Example 6 | Cu-10 at % Ni | Good (over range, >5MΩ) | Good (12MΩ) | Good |
| Example 7 | Cu-1 at % Mn | Good (over range, >5MΩ) | Good (6MΩ) | Good |
| Example 8 | Cu-5 at % Mn | Good (over range, >5MΩ) | Good (7MΩ) | Good |
| Example 9 | Cu-10 at % Mn | Good (over range, >5MΩ) | Good (9MΩ) | Good |
| Comaprative Example 2 | Pure Cu (with no Si oxide layer) | Poor (300Ω) | Poor (over range, >50MΩ) | Poor |

Examples 3 to 9

The evaluation method is as follows. First, an interconnecting structure in Example 3 is prepared that comprises a glass substrate 10, an a-Si layer 20 formed over the glass substrate 10, an n+-Si layer 22 formed over the a-Si layer 20, a 5 nm thick Si oxide layer 24 formed over the n+-Si layer 22, and a pure Cu layer 32 formed over the Si oxide layer 24. Also, interconnecting structures in Examples 4 to 9 are prepared that each comprise a glass substrate 10, an a-Si layer 20 formed over the glass substrate 10, an n+-Si layer 22 formed over the a-Si layer 20, a 5 nm thick Si oxide layer 24 formed over the n+-Si layer 22, and a Cu alloy layer 30 formed over the Si oxide layer 24. The Cu alloy layer 30 of the interconnecting structure in Example 4 is formed of a Cu-1 at % Ni, the Cu alloy layer 30 of the interconnecting structure in Example 5 is formed of a Cu-5 at % Ni, the Cu alloy layer 30 of the interconnecting structure in Example 6 is formed of a Cu-10 at % Ni, the Cu alloy layer 30 of the interconnecting structure in Example 7 is formed of a Cu-1 at % Mn, the Cu alloy layer 30 of the interconnecting structure in Example 8 is formed of a Cu-5 at % Mn, and the Cu alloy layer 30 of the interconnecting structure in Example 9 is formed of a Cu-10 at % Mn.

Comparative Example 2

Also, an interconnecting structure in Comparative Example 2 is prepared that comprises a glass substrate 10, an a-Si layer 20 formed over the glass substrate 10, an n+-Si layer 22 formed over the a-Si layer 20, and a pure Cu layer 32 formed over the n+-Si layer 22.

The diffusion barrier property of the oxide film 24 is first evaluated with the pure Cu layer 32 or the Cu alloy layer 30 removed by wet etching, and by measuring the sheet resistance of the exposed Si oxide layer 24. In Comparative Example 2, the pure Cu layer 32 is removed, and the sheet resistance of the exposed n+-Si layer 22 is measured. In the interconnecting structures in Examples 3 to 9, it has been verified that the sheet resistance of the oxide layer 24 results in an over range at a maximum range of 5 MΩ, and its excellent diffusion barrier property has therefore been shown. On the other hand, the interconnecting structure in Comparative Example 2 has no oxide layer 24. In the interconnecting structure in Comparative Example 2, a slight electrical conduction property is then observed at 300Ω. This is considered to be caused by the element in the n+-Si layer 22 diffusing into the a-Si layer 20 because of no oxide layer 24 having the diffusion barrier property. From this, it is shown that the Si oxide layer 24 permits the diffusion barrier to the Cu diffusion.

The electrical conduction property of the oxide film 24 is evaluated with the same method as in the "ohmic contact property between the a-Si layer 22, and the pure Cu layer 32 and the Cu—Ni alloy layer 30" above. Further, the adhesion property of the oxide film 24 is evaluated by heat treatment of the interconnecting structures in Examples 3 to 9, and Comparative Example 2 in a vacuum at 300° C. for 1 hour, and subsequent outdoor exposure testing for 1 month, and visual checking of the presence/absence of peeling pure Cu layer 32 and Cu alloy layer 30.

It has been verified that the interconnecting structures in Examples 3 to 9 can all result in good electrical conduction, and good adhesion. The interconnecting structures in Examples 4 to 9 using the Cu—Ni or Cu—Mn alloy layer 30 result in the lower resistances in the electrical conduction property evaluation and therefore better ohmic contact properties, respectively, compared to the interconnecting structure in Example 3 using the pure Cu layer 32. This is considered to be because after the heat treatment, the Si oxide layer 24 and the Cu alloy constituent of the Cu alloy layer 30 react to thereby form an oxide layer containing the additive element.

On the other hand, the interconnecting structure in Comparative Example 2 results in no electrical conduction, and in poor adhesion. From this, it is shown that the presence of the Si oxide layer 24 permits enhancement in the adhesion of the pure Cu layer 32 and the Cu alloy layer 30 to the n+-Si layer 22.

Although the invention has been described with respect to the above embodiments, the above embodiments are not intended to limit the appended claims. Also, it should be noted that not all the combinations of the features described in the above embodiments are essential to the means for solving the problems of the invention.

What is claimed is:

1. An interconnecting structure production method, comprising:
  providing a substrate;
  forming a semiconductor layer on the substrate;

forming a doped semiconductor layer on the semiconductor layer, the doped semiconductor layer containing a dopant;

forming an oxide layer in a surface of the doped semiconductor layer by heating the surface of the doped semiconductor layer in atmosphere of an oxidizing gas with a water molecule contained therein;

forming an alloy layer on the oxide layer, the alloy layer includes a Cu alloy layer comprising Cu and an additive element;

forming an interconnecting layer on the alloy layer; and forming a diffusion barrier layer by heating the Cu alloy layer at a temperature of not less than 200° C. and not more than 300° C. to allow the additive element contained in the Cu alloy layer to be condensed.

2. The interconnecting structure production method according to claim 1, wherein
the forming of the oxide layer includes bubbling the oxidizing gas through water to allow the oxidizing gas to contain water molecules.

3. The interconnecting structure production method according to claim 2, wherein
the semiconductor layer includes an amorphous silicon layer,
the doped semiconductor layer includes a silicon layer containing the dopant, and
the forming of the oxide layer includes using an ozone gas as the oxidizing gas, heating the doped silicon layer in the ozone gas at a temperature of not less than 200° C. and not more than 300° C. to form a silicon oxide layer in the surface of the doped silicon layer.

4. The interconnecting structure production method according to claim 3, wherein
the interconnecting layer includes a Cu layer.

5. The interconnecting structure production method according to claim 1, wherein
the additive element comprises at least one metal element selected from the group consisting of Ni, Co, Mn, Zn, Mg, Al, Zr, Ti, Fe, and Ag.

6. The interconnecting structure production method according to claim 1, wherein
the Cu alloy layer comprises Cu, and Ni or Mn with a concentration of not less than 1 at % and not more than 5 at % relative to the Cu.

7. The interconnecting structure production method according to claim 5, wherein
the interconnecting layer includes the Cu layer comprising oxygen free copper with a purity of not less than 3 Nines.

8. The interconnecting structure production method according to claim 1, wherein
the forming of the alloy layer includes sputtering a copper alloy sputtering target material comprising Cu and at least one metal element selected from the group consisting of Ni, Co, Mn, Zn, Mg, Al, Zr, Ti, Fe, and Ag as the additive element, or a copper alloy sputtering target material comprising Cu, and Ni or Mn with a concentration of not less than 1 at % and not more than 5 at % relative to the Cu, to form the alloy layer on the oxide layer, and
the forming of the interconnecting layer includes sputtering a copper sputtering target material comprising oxygen free copper with a purity of not less than 3 Nines to form the interconnecting layer on the alloy layer.

* * * * *